United States Patent
Jaklitsch

(10) Patent No.: US 7,315,797 B2
(45) Date of Patent: Jan. 1, 2008

(54) METHOD AND SYSTEM FOR ELIMINATING VSWR ERRORS IN PHASE AND AMPLITUDE MEASUREMENTS

(75) Inventor: James Jaklitsch, Parkton, MD (US)

(73) Assignee: AAI Corporation, Hunt Valley, MD (US)

( * ) Notice: Subject to any disclaimer, the term of this patent is extended or adjusted under 35 U.S.C. 154(b) by 0 days.

(21) Appl. No.: 11/369,997

(22) Filed: Mar. 8, 2006

(65) Prior Publication Data

US 2007/0213947 A1    Sep. 13, 2007

(51) Int. Cl.
*H04B 15/00*   (2006.01)
*G01R 29/26*   (2006.01)
*G06F 19/00*   (2006.01)

(52) U.S. Cl. .................. 702/189; 702/72; 702/191

(58) Field of Classification Search ................ 702/189, 702/190, 191, 72, 79; 375/332, 316, 295; 324/612, 615, 619; 342/165, 173
See application file for complete search history.

(56) References Cited

U.S. PATENT DOCUMENTS

| | | | |
|---|---|---|---|
| 5,461,314 A * | 10/1995 | Arakawa et al. ............. | 324/318 |
| 5,937,006 A | 8/1999 | Clark et al. | |
| 5,974,362 A | 10/1999 | Owen | |
| 6,041,077 A | 3/2000 | Clark et al. | |
| 6,064,694 A | 5/2000 | Clark et al. | |
| 6,211,663 B1 * | 4/2001 | Moulthrop et al. ....... | 324/76.23 |
| 6,484,124 B1 | 11/2002 | MacMullen | |
| 6,486,679 B1 | 11/2002 | Holt | |
| 2002/0158622 A1 | 10/2002 | Rayne et al. | |
| 2005/0271164 A1 * | 12/2005 | Moulthrop et al. ......... | 375/332 |

* cited by examiner

*Primary Examiner*—Bryan Bui
(74) *Attorney, Agent, or Firm*—Venable, LLP; Jeffri A. Kaminski

(57) ABSTRACT

A method and system for canceling VSWR effects is provided. The exemplary method includes taking multiple measurements of parameters of a signal with a phase of the microwave signal shifted for each measurement; and processing the measured parameters to eliminate VSWR effects and determine the true magnitude and phase of the signal.

15 Claims, 2 Drawing Sheets

METHOD AND SYSTEM FOR ELIMINATING VSWR ERRORS IN PHASE AND AMPLITUDE MEASUREMENTS

BACKGROUND OF THE INVENTION

1. Field of the Invention

The present invention relates generally to a system for measuring selected performance characteristics of electronic components. In one preferred embodiment, the present invention comprises a method and apparatus for evaluating selected performance criteria of microwave power components, and in particular, microwave transmitter and receiver components.

2. Related Art

In order to control equipment such as sensors, guns, and cameras, microwave components have long been critical features of radar systems, electronic devices, and other systems. Errors in the parameters of microwave components translate directly into decreased accuracy and precision of the equipment, systems, and processes in which they are employed. There has long been a need to improve the accuracy, reliability, and correlation of measurements of microwave power transmitter and receiver components. Improvement in the accuracy of the performance characteristics of microwave components contributes directly to improved accuracy and precision in the systems in which they are used.

A major source of error when measuring the power of microwave components is Voltage Standing Wave Ratio (VSWR). VSWR is a phenomena that occurs with all microwave systems. VSWR effects are produced whenever there is a mismatch in impedance in a microwave cable or transmission device. Whenever a microwave measurement is performed, the measurement includes a reflected wave resulting from the VSWR effects. The measurement is actually the sum of whatever is being measured plus the reflected wave. The VSWR effects produce errors in measurements of microwave systems and limit the ability to accurately measure both the amplitude and the phase of the microwave signal.

Past attempts at limiting or removing the error caused by VSWR have focused on minimizing the impedance discontinuities that give rise to signal reflections and cause voltage standing waves to be produced. Once the impedance discontinuities are minimized to the fullest extent possible, the remaining VSWR effect is treated as an irreconcilable system error. In the known prior art, there is no effective means of removing the error caused by VSWR.

BRIEF SUMMARY OF THE INVENTION

In an exemplary embodiment of the invention, a method for canceling VSWR effects is provided. The exemplary method comprises taking multiple measurements of parameters of a signal with a phase of the microwave signal shifted for each measurement; and processing the measured parameters to eliminate VSWR effects and determine the true magnitude and phase of the signal.

In a further embodiment of the invention, an exemplary embodiment comprises determining an In-Phase ($I_1$) and a Quaduture-phase ($Q_1$) representation of a microwave signal: determining an In-Phase ($I_1$) and a Quaduture-phase ($Q_2$) representation of the microwave signal with its phase shifted by 180 degrees; and determining a true magnitude and a true phase of the signal under test based on at least $I_1$, $Q_1$, $I_2$, and $Q_2$.

In a further embodiment of the invention a system is provided. The system comprises a measurement receiver adapted to receive a signal under test and to measure an In-Phase ($I_1$) and a Quaduture-phase ($Q_1$) representation of the signal under test and an In-Phase ($I_1$) and a Quaduture-phase ($Q_2$) representation of the signal under test with its phase shifted; and an analyzer adapted to receive $I_1$, $Q_1$, $I_2$, and $Q_2$ from the measurement receiver and to determine a true magnitude and phase of the signal under test based on $I_1$, $Q_1$, $I_2$, and $Q_2$.

Further objectives and advantages, as well as the structure and function of preferred embodiments will become apparent from a consideration of the description, drawings, and examples.

BRIEF DESCRIPTION OF THE DRAWINGS

The foregoing and other features and advantages of the invention will be apparent from the following, more particular description of a preferred embodiment of the invention, as illustrated in the accompanying drawings wherein like reference numbers generally indicate identical, functionally similar, and/or structurally similar elements.

DETAILED DESCRIPTION OF THE INVENTION

Embodiments of the invention are discussed in detail below. In describing embodiments, specific terminology is employed for the sake of clarity. However, the invention is not intended to be limited to the specific terminology so selected. While specific exemplary embodiments are discussed, it should be understood that this is done for illustration purposes only. A person skilled in the relevant art will recognize that other components and configurations can be used without parting from the spirit and scope of the invention.

Embodiments of the present invention may include apparatuses for performing the operations herein. An apparatus may be specially constructed for the desired purposes, or it may comprise a general purpose device selectively activated or reconfigured by a program stored in the device.

Embodiments of the invention may be implemented in one or a combination of hardware, firmware, and software. Embodiments of the invention may also be implemented as instructions stored on a machine-accessible medium, which may be read and executed by a computing platform to perform the operations described herein. A machine-accessible medium may include any mechanism for storing or transmitting information in a form readable by a machine (e.g., a computer). For example, a machine-accessible medium may include read only memory (ROM); random access memory (RAM); magnetic disk storage media; optical storage media; flash memory devices; electrical, optical, acoustical or other form of propagated signals (e.g., carrier waves, infrared signals, digital signals, etc.), and others.

Embodiments of the invention provide a method and system to eliminate the VSWR effect in measurement results of microwave components. In embodiments of the invention, multiple measurements of a signal under test are taken. The multiple measurements are processed to cancel out the VSWR effect and leave only the actual amplitude and phase of the signal under test. Multiple measurements may be taken with the phase of the signal under test shifted. The phase of the signal under test should be shifted so as to cancel out the VSWR effects. For example, for each measurement taken of the signal under test, a corresponding measurement should be taken with the phase of the signal under test inverted. The multiple measurements may be processed to cancel out completely VSWR effects.

Figure 1:
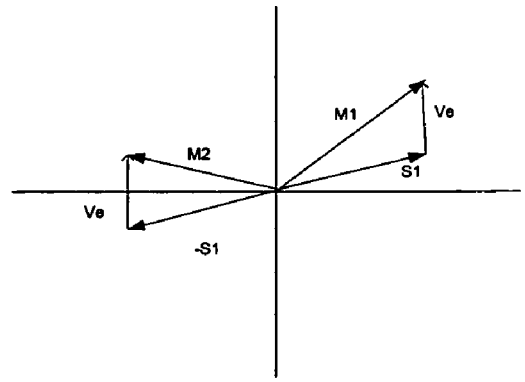
FIG. 1 illustrates a vector diagram of microwave signals.

For example, FIG. 1 illustrates a first measured signal M1. M1 is the vector sum of the true signal S1 and an unknown error Ve due to VSWR effects. FIG. 1 also illustrates a second measured signal M2. M2 is the vector sum of a signal that is the inverse of the signal S1 and the same unknown error Ve. By subtracting the measured signals M1-M2, the unknown error Ve can be canceled and the true signal S1 determined as if there is perfect impedance matching.

Figure 2:
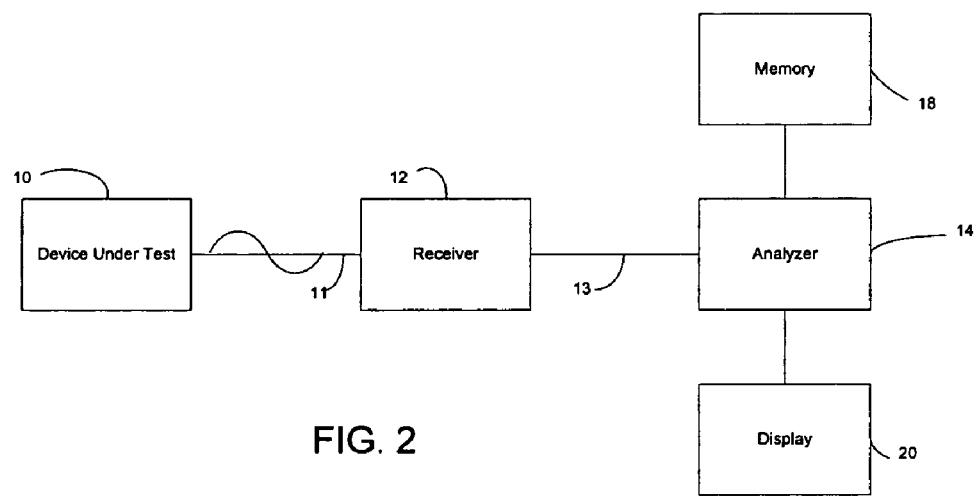
FIG. 2 illustrates a system according to an exemplary embodiment of the present invention.
Figure 3:
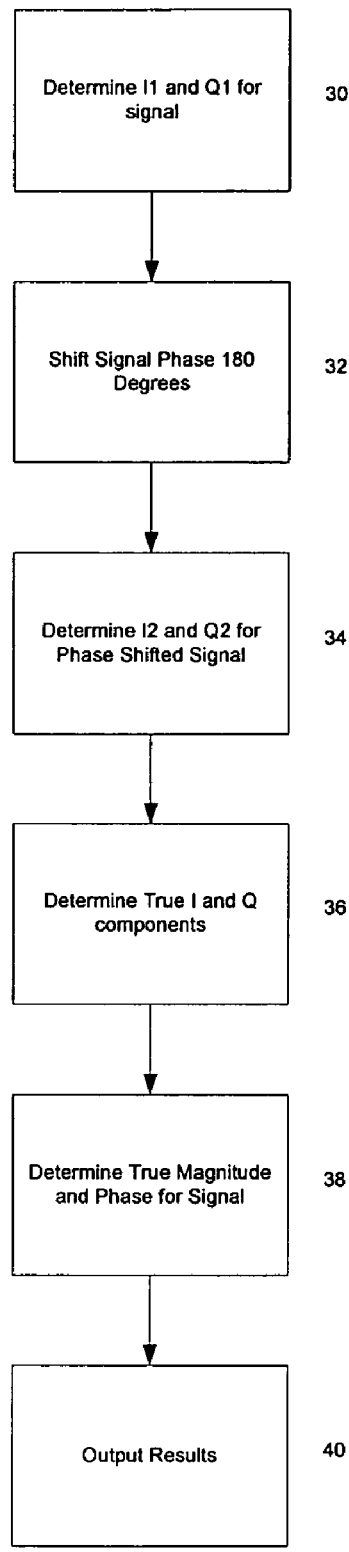
FIG. 3 illustrates a flowchart of a method according to an exemplary embodiment of the present invention.

FIG. 2 illustrates an exemplary system according to an embodiment of the invention. A device under test (DUT) 10 provides a signal under test, for example via a microwave cable 11, to a measurement receiver 12. The DUT 10 may be any type of microwave component. The measurement receiver 12 should be able to take vector measurements of the signal under test. In embodiments of the invention, the measurement receiver 12 may be capable of producing an In-Phase (I) and a Quaduture-phase (Q) representation of the signal under test. The measurement receiver 12 may be any type of signal receiver, for example a vector voltmeter or A/D converter configured for vector measurement. The measurement receiver 12 provides an output, for example via a microwave cable 13, to analyzer 14. The analyzer 14 may communicate with memory 18 to store and retrieve information. The memory 18 may be internal or external to the analyzer 14. The analyzer 14 may perform the exemplary method described below to eliminate VSWR effects from the measured signal. Output may then be provided and displayed on display 20 in the desired fashion as is known in the art.

The measurement receiver 12 and analyzer 14 may be separate components or combined together, may be digital or analog-based systems, and/or may be embedded in hardware, coded, or written into application or operating system software in a PC-based or other hardware system. The measurement receiver 12 may measure other signal parameters from which I and Q may be determined, for example by the analyzer 14 or other components.

Turning now to FIG. 2, an exemplary method according to the present invention is described. A signal under test may be generated by the DUT 10. The signal under test may be generated with an arbitrary phase and magnitude. The signal under test is provided to the measurement receiver, for example via cable 11 or other means. Measurement receiver 12 may measure various parameters of the signal under test. A first measurement M1 may be made, for example, by measurement receiver 12 to produce an $I_1$ and $Q_1$ representation of the signal under test, step 30. $I_1$ and $Q_1$ may be provided via cable 13 to analyzer 14. The measurement receiver 12 may alternatively measure parameters of the signal under test from which $I_1$ and $Q_1$ can be determined, for example by the analyzer 14.

$I_1$ and $Q_1$ may be provided to the analyzer and/or stored, at least temporarily, in memory 18. The phase of the signal under test is then shifted at its source, step 32. In this example, the phase of the signal under test is shifted by 180 degrees at the DUT 10. The magnitude of the signal under test should not be adjusted. A second measurement $M_2$ of the signal may be taken. Based on the second measurement $M_2$, $I_2$ and $Q_2$ for the phase shifted signal under test are determined, step 34. $I_2$ and $Q_2$ may be provided to the analyzer 12 and may be stored, at least temporarily, in memory 18.

A true reading for the I and Q components of the signal under test may be computed from the measured components $I_1$, $Q_1$, $I_2$, $Q_2$, step 36. The analyzer may receive $I_1$, $Q_1$, $I_2$, $Q_2$, from the memory and determine I and Q For example, the following equations may be used to determine I and Q.

$$I=(I_1-I_2)/2 \quad Q=(Q_1-Q_2)/2$$

The true magnitude and phase of the signal under test may be determined from the true I and Q components, step 38.

Magnitude (dB)=20 $\text{Log}_{10}[\text{Sqrt}[I^2+Q^2]]$;

Phase (Degrees)=$(180/\pi)\text{ArcTan}[Q/I]$.

The analyzer 14 may determine the true magnitude and phase based on these equations. The true magnitude and phase, as well as other desired information, may then be shown on display 20, step 40.

In further embodiments of the invention, more then two measurements of the signal under test may be made and processed in accordance with the method outlined above. For example, four measurements may be take with the phase of the signal under test shifted 0 degrees, 90 degrees, 180 degrees and 270 degrees. I and Q representations for each of the four measurements are determined. The true I and Q are determined based on the measured I and Q representations. The true magnitude and phase of the signal under test may then be determined as described above. Multiple signal measurements are taken and processed to cancel out the VSWR effects. The number of measurements taken of the signal under test may be extended to a sweep through all phases.

The embodiments illustrated and discussed in this specification are intended only to teach those skilled in the art the best way known to the inventors to make and use the invention. Nothing in this specification should be considered as limiting the scope of the present invention. All examples presented are representative and non-limiting. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

What is claimed is:

1. A method for reducing VSWR effects, comprising:
 receiving at least one signal having a phase;
 taking a first measurement of signal parameters;
 receiving the signal with its phase shifted;
 taking a second measurement of the signal parameters with the phase shifted;
 processing the first and second measured parameters to eliminate VSWR effects and determine a true magnitude and phase of the signal; and
 outputting the true magnitude and phase of the signal.

2. The method of claim 1,
 wherein the processing step further comprises determining a true In-Phase (I) and a Quadrature-phase (Q) representation of the signal based on the first and second measurements.

3. The method of claim 2, further comprising determining the true magnitude and phase of the signal based on at least I and Q.

4. The method of claim 2, further comprising shifting the phase of the signal under test 180 degrees to generate the signal with its phase inverted.

5. The method of claim 1, wherein the first and second measuring steps further comprise:

determining an In-Phase ($I_1$) and a Quadrature-phase ($Q_1$) representation of the signal: and determining an In-Phase ($I_2$) and a Quadrature-phase ($Q_2$) representation of the signal with its phase shifted.

6. The method of claim 5, further comprising determining the true I and Q of the signal under test at least based on $I_1$, $Q_1$, $I_2$, and $Q_2$.

7. The method of claim 6, wherein $I=(I_1-I_2)/2$ and $Q=(Q_1-Q_2)/2$.

8. The method of claim 1 further comprising shifting the phase of the signal by 180 degrees.

9. A method, comprising:
determining an In-Phase ($I_1$) and a Quadrature-phase ($Q_1$) representation of a microwave signal:

determining an In-Phase ($I_1$) and a Quadrature-phase ($Q_2$) representation of the microwave signal with its phase shifted by 180 degrees; determining a true In-Phase (I) and a Quadrature-phase (Q) representation of the signal based on at least $I_1$, $Q_1$, $I_2$, and $Q_2$;

determining a true magnitude and a true phase of the microwave signal based on I and Q; and outputting the true magnitude and the true phase to a display for display.

10. The method of claim 9, wherein $I=(I_1-I_2)/2$ and $Q=(Q_1-Q_2)/2$.

11. The method of claim 9, further comprising:
generating the signal with a device under test;
providing the signal and the signal with its phase shifted to a receiver; and
measuring $I_1$, $Q_1$, $I_2$, and $Q_2$, with the receiver.

12. The method of claim 9, further comprising:
providing $I_1$, $Q_1$, $I_2$, and $Q_2$, to a computer; and determining the true I and Q with a computer based on $I_1$, $Q_1$, $I_2$, $Q_2$.

13. A system, comprising:
a measurement receiver adapted to receive a signal under test and to measure an In-Phase ($I_1$) and a Quadrature-phase ($Q_1$) representation of the signal under test and an In-Phase ($I_1$) and a Quadrature-phase ($Q_2$) representation of the signal under test with its phase shifted; and an analyzer adapted to receive $I_1$, $Q_1$, $I_2$, and $Q_2$ from the measurement receiver and to determine a true magnitude and phase of the signal under test based on $I_1$, $Q_1$, $I_2$, and $Q_2$ wherein the analyzer determines a true I and Q for the signal under test based on at least $I_1$, $Q_1$, $I_2$, and $Q_2$.

14. The system of claim 13, wherein the analyzer determines the true magnitude and the true phase based on at least the true I and Q.

15. A method, comprising:
determining an In-Phase ($I_1$) and a Quadrature-phase ($Q_1$) representation of a microwave signal:

determining an In-Phase ($I_1$) and a Quadrature-phase ($Q_2$) representation of the microwave signal with its phase shifted by 180 degrees;

providing $I_1$, $Q_1$, $I_2$, and $Q_2$, to a computer;

determining a true I and Q representation of the microwave signal with the computer based on $I_1$, $Q_1$, $I_2$, $Q_2$;

determining a true magnitude and a true phase of the signal under test based on at least I and Q; and displaying at least one of the true magnitude and the true phase on a display.

* * * * *